United States Patent [19]
Rice

[11] Patent Number: 5,929,701
[45] Date of Patent: Jul. 27, 1999

[54] FEED FORWARD AMPLIFIER SYSTEM AND METHOD

[75] Inventor: Christopher W. Rice, Parsippany, N.J.

[73] Assignee: AT&T Corp., Middletown, N.J.

[21] Appl. No.: 08/766,923

[22] Filed: Dec. 13, 1996

[51] Int. Cl.$^6$ .................................................. H03F 3/66
[52] U.S. Cl. ........................................... 330/52; 330/151
[58] Field of Search ........................... 330/52, 149, 151; 455/114

[56] References Cited

U.S. PATENT DOCUMENTS

| | | | |
|---|---|---|---|
| 4,580,105 | 4/1986 | Myer | 330/149 |
| 4,870,519 | 9/1989 | Myer | 330/149 |
| 4,873,492 | 10/1989 | Myer | 330/86 |
| 4,885,551 | 12/1989 | Myer | 330/52 |
| 5,304,945 | 4/1994 | Myer | 330/149 |
| 5,386,198 | 1/1995 | Ripstrand et al. | 330/52 |

Primary Examiner—Steven J. Mottola

[57] ABSTRACT

A dual loop feed forward amplifier and method of amplification. The dual loop feed forward amplifier contains at least two amplification stages that introduce unwanted intermodulation products into the output signal. A spreading tone is introduced to the RF signal in between the first and second amplification stages. The spreading tone is created by a bi-phase modulator that spreads an input tone in accordance with a spread PN-code. After the spreading tone is amplified by the subsequent stages of the feed forward amplifier, the spreading tone is despread by the same spread PN-code. The resulting output tone is mixed with the original input tone. The output of the mixer is then filtered to remove the unwanted spurious products produced by the mixer. The feed forward amplifier is then actively adjusted by a computer controller to reduce any difference between input tone and the output tone until a desired signal-to-interference ratio is obtained.

17 Claims, 2 Drawing Sheets

FEED FORWARD AMPLIFIER SYSTEM AND METHOD

BACKGROUND OF THE INVENTION

1. Field of the Invention

The present invention relates in general to feed forward amplifier circuits. More specifically, the present invention relates to feed forward amplifier circuits with the ability to substantially null distortion produced by intermodulation products, thereby producing an output with a desired signal-to-interference ratio.

2. Description of the Prior Art

There are many applications in wireless communications that utilize feed forward amplifiers to amplify signals. However, a disadvantage of using feed forward amplifiers is that distortion is introduced into the signal as it is amplified, thereby resulting in an output signal that has a reduced signal-to-interference ratio. In the prior art there are many feed forward amplifiers that have been specifically designed to reduce the amount of distortion introduced during amplification. One such prior art approach is the use of a dual loop feed forward amplifier that actively nulls distortion. Such a prior art feed forward amplifier is shown in FIG. 1.

Referring to FIG. 1, a prior art dual loop feed forward amplifier 10 is shown. An RF signal is introduced into the signal input 12 of the dual loop feed forward amplifier 10. The purpose of the dual loop feed forward amplifier 10 is to amplify the RF signal with as little distortion as is possible. As the RF signal is received, it is split at coupler 13 between a main amplification line 14 and a first loop line 16. On the main amplification line 14, the RF signal passes through a series of amplifiers 18, wherein the RF signal is amplified. As the RF signal passes through the amplifiers 18, distortions are added to the RF signal. The RF signal with distortions is then again split at coupler 19, wherein the distorted signal is directed down to the first loop line 16 at coupler 21. The original RF signal traveling along the first loop line 16 passes through a delay line 20, wherein the original RF signal is delayed so as to be 180° out of phase. As the out-of-phase signal is combined with the distorted signal at coupler 21, all elements of the two signals cancel except for the distortion elements that were added by the amplifiers 18. As such, at point P on the first loop line 16, only the distortion elements of the signal are present. The distortion elements of the signal then pass though an error amplifier 22, thereby producing an amplified distortion signal.

The amplified distortion signal is coupled to a first loop null point 24 by a coupler 26. The first loop null point 24 is coupled to a computer controller 28. The computer controller 28 is also coupled to a phase shifter circuit 30 positioned on the main amplification line 14 in between the RF input port 12 and the first amplifier 18. The computer controller 28 actively monitors the amplified distortion signal and adjusts the phase shifter circuit 30 within allowable bandwidth parameters in an attempt to minimize the amplified distortion signal.

The second loop of the dual loop feed forward amplifier 10 takes the amplified distortion signal and couples it back up to the main amplification line 14. The original amplified RF signal that travels along the main amplification line 14 passes through a second delay line 34 that changes the phase of the amplified RF signal so that it matches that of the amplified distortion signal. As a result, when the amplified distortion signal is superimposed over the original amplified RF signal, the error fundamentals carried by the original amplified RF signal are substantially canceled. This provides an amplified RF signal at the output port 36 with greatly reduced levels of distortion.

A phase shifter circuit 40 is also disposed within the second loop in between the error amplifier 22 and the coupler 41 that superimposes the distortion signal back onto the main amplification line 14. The phase shifter circuit 40 is selectively set at values intended to minimize the differences between the amplified distortion signal and the actual distortion created by the amplifiers 18 on the main amplification line 14. In order to "fine tune" the second loop, expensive and complex tuning techniques are commonly employed. Such prior art techniques require the use of advanced DSP software or clear channel hopping. When digital signal processing components or other additional components are used, the fine tuning of the feed forward amplifier 10 may lead to high costs for operation and maintenance. Furthermore, such prior art fine tuning techniques can produce undesirable changes in gain, distortion, bandwidth and/or impedance. It will also be understood that the filtering out of noise or intermodulation products is difficult since the intermodulation products are usually within the passband of the desired user signal. As a result, such filtering can result in unwanted amplitude or phase adjustments.

A need therefore exists for an improved dual loop feed forward amplifier that can efficiently and cost effectively reduce intermodulation products in an amplified RF signal, while producing a signal with a high signal-to-interference ratio without diminishing the amplitude level of the RF signal.

SUMMARY OF THE INVENTION

The present invention is a dual loop feed forward amplifier and method of amplification. The dual loop feed forward amplifier contains at least two amplification stages that introduce unwanted intermodulation products into the output signal. To help null the feed forward amplifier and remove the intermodulation products a spreading tone is introduced to the RF signal in between the first and second amplification stages. The spreading tone is created by a bi-phase modulator that spreads an input tone in accordance with a spread PN-code. After the spreading tone is amplified by the subsequent stages of the feed forward amplifier, the spreading tone is despread by the same spread PN-code that was used to spread the original input tone. After the spreading tone is despread, the resulting output tone is mixed with the original input tone, wherein the two tones substantially cancel leaving only the signal components that are different between the two signals. The output of the mixer is then filtered to remove the spurious mixing products produced in the mixer. The feed forward amplifier is then actively adjusted by a computer controller to reduce any difference between input tone and the output tone until a desired signal-to-interference ratio is obtained.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE DRAWINGS

Figure 1:
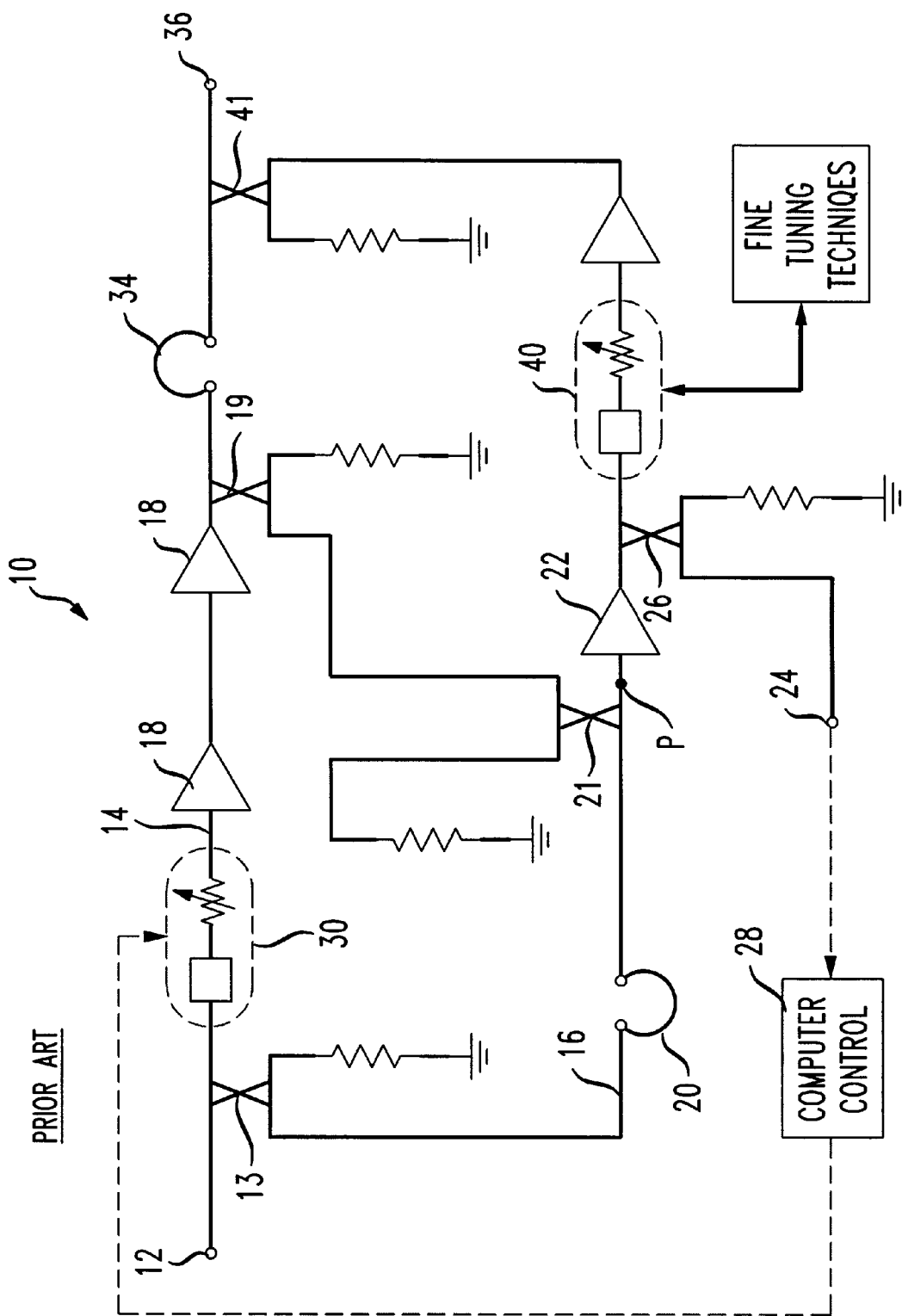
FIG. 1 is a circuit schematic illustrating a prior art feed forward amplifier.
Figure 2:
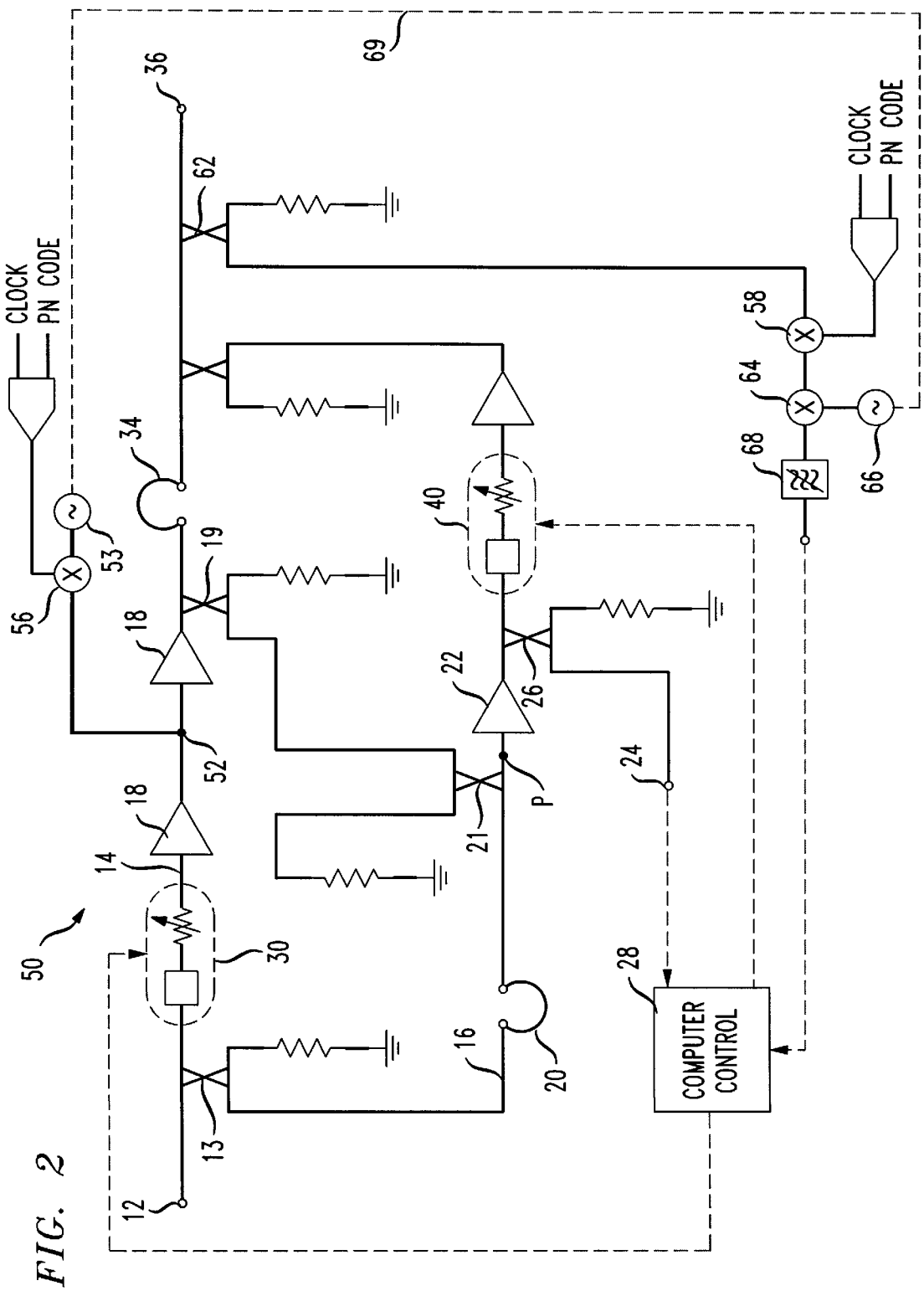
FIG. 2 is circuit schematic illustrating one embodiment of a feed forward amplifier in accordance with the present invention.

In FIG. 2, a dual loop feed forward amplifier circuit 50 is shown in accordance with the present invention. The dual loop amplifier circuit 50 shares many of the same components and features as does the prior art circuit previously shown and described in connection with FIG. 1. As a result, components and features of the present invention dual loop feed forward amplifier 50 that are the same as that of the prior art will be referenced with the same reference numbers that were used when describing the prior art.

An RF signal is initially introduced into the signal input 12 of the dual loop feed forward amplifier 50. As the RF signal is received, it is split at coupler 13 between a main amplification line 14 and a first loop line 16. On the main amplification line 14, the RF signal is amplified by a series of amplifiers 18, wherein distortions are added to the RF signal. The RF signal with distortions is then again split at coupler 19, wherein the distorted signal is directed down to the first loop line 16 at coupler 21. The original RF signal traveling along the first loop line 16 passes through a delay line 20, wherein the original RF signal is delayed to be 180° out of phase. As the out-of-phase signal is superimposed over the distorted signal at coupler 21, all elements of the two signals cancel except for the distortion elements added by the amplifiers 18. As such, at point P on the first loop line 16, only the distortion elements of the signal are present. The distortion elements of the signal then pass though a error amplifier 22, thereby producing an amplified distortion signal.

The amplified distortion signal is coupled to a first loop null point 24 by a coupler 26. As has been previously explained, the first loop null point 24 is coupled to a computer controller 28 that controls a phase shifter circuit 30 positioned on the main amplification line 14 in between the RF input port 12 and the first of the amplifiers 18.

The second loop of the dual loop feed forward amplifier 50 takes the amplified distortion signal and couples it back to the main amplification line 14. The original amplified RF signal passes through a second delay line 34 that changes the phase of the amplified signal so that it matches that of the amplified distortion signal. As a result, when the amplified distortion signal is superimposed over the original amplified RF signal, the error fundamentals carried by the original amplified RF signal are substantially canceled.

In the present invention feed forward amplifier 50, an oscillator 53 is provided that produces an input tone. The input tone is fed into a bi-phase modulator 56. A spread PN-code is read by the bi-phase modulator 56, wherein the bi-phase modulator 56 spreads the input tone in accordance with the spread PN-code. The spreading tone is then injected into the main amplification line 14 at a point after the first amplifier stage. By introducing the spreading tone after the first stage of amplification, the injected tone exists at a level below the level of the intermodulation products introduced by the first amplification stage. This enables the spreading tone to be easily separated from the intermodulation products in a later step. The bi-phase modulator 56 is coupled to the main amplification line 14 at a point before the second of the amplifiers 18 through coupler 52. As a result, the spreading tone is amplified by the second stage of the amplifiers 18.

A second bi-phase modulator 58 is coupled to the main amplification line 14 at a point just prior to the RF output 36. The initial spreading tone applied to the amplified RF signal is therefore directed to the second bi-phase modulator 58 by coupler 62. The second bi-phase modulator 58 despreads the spreading tone by the same PN-code that was used to create the initial spreading tone. The PN-code is preferable hardwired to both the first bi-phase modulator 56 and the second bi-phase modulator 58 to produce optimum coding gain and correlation. By despreading the spreading tone by the same PN-code the second bi-phase modulator creates an output tone. After the injected spreading tone is despread, the resulting output tone is fed to a mixer 64. The mixer 64 is coupled to an oscillator 66 that is synchronized with the oscillator 53 used by the first bi-phase modulator 56. As is indicated by line 69, the first bi-phase modulator 56 and the mixer 64 may share the same oscillator, thereby ensuring accurate synchronization between these elements. In the mixer 64, the output tone produced by the second bi-phase modulator 58 is mixed with the input tone. After cancellation within the mixer 64, the resultant output of the mixer 64 is then passed though a narrow band filter 68 to reduce the noise bandwidth of the signal and filter other spurious signals.

The computer controller 28 is coupled through a power detector and A/D (not shown) to the narrow band filter 68. The output of the narrow band filter 68 corresponds to the difference between the input tone produced by the oscillator 66 and the output despread tone of the second bi-phase modulator 64. The computer controller 38 monitors the output of the narrow band filter 68, wherein the computer controller 28 adjusts the feed forward amplifier 50 to null the output of the narrow band filter 68. The computer controller 28 is coupled to the phase shifter circuit 40 in the second loop of the feed forward amplifier 50. Using the output of the narrow band filter 68 as a control, the computer controller 28 actively regulates the phase shifter circuit 40, until a predetermined signal-to-interference ratio is detected. Consequently, the best null possible can be achieved in the second loop of the dual loop feed forward amplifier 50 over the entire spreading bandwidth. It can therefore be seen that complex prior art tuning techniques intended to "fine tune" the second loop of the feed forward amplifier are no longer required. Rather, the present invention feed forward amplifier 50 enables both loops in the dual loop configuration to be actively controlled or nulled by a single computer controller, wherein the first loop acts to null the main input radio signals and the second loop acts to null the injected spreading tone, which also minimizes the intermodulation products.

It will be understood that the embodiments of the present invention specifically shown and described are merely exemplary and that a person skilled in the art can make alternate embodiments using different configurations and functionally equivalent components. All such alternate embodiments are intended to be included in the scope of this invention as set forth in the following claims.

What is claimed is:

1. A dual loop feed forward amplifier, comprising:
   an RF signal input and an RF signal output;
   at least one amplifier stage disposed between said RF signal input and said RF signal output wherein said at least one amplifier stage produces intermodulation products in an RF signal traveling from said RF signal input to said RF signal output;
   a tone source for producing an input tone;
   a spreader for spreading said input tone with a predetermined spread code to produce a spreading tone, wherein said spreading tone is amplified by at least one amplifier stage;
   a despreader for despreading said spreading tone and producing an output tone;

the spreader and despreader comprising bi-phase modulators;

a mixer for mixing said input tone with said output tone; and a null controller coupled to said mixer for actively nulling differences between said input tone and said output tone t achieve a desired signal-to-interference ratio.

2. The amplifier according to claim 1, wherein said intermodulation products introduced by said at least one amplifier stage exist at a predetermined level and said spreading tone is applied at a level below said predetermined level.

3. The amplifier according to claim 1, wherein said despreader despreads said spreading tone using said predetermined spread code.

4. The amplifier according to claim 1, further including a narrow band filter disposed between said mixer and said null controller, wherein said narrow band filter substantially filters said intermodulation products produced by said at least one amplifier stage.

5. The amplifier according to claim 4, wherein said input tone is produced by an oscillator and said mixer is coupled to said oscillator to receive a synchronized input tone.

6. The amplifier according to claim 1, wherein said at least one amplifier stage is configured to contain a first amplifier stage and at least one second amplifier stage wherein said spreading tone is injected in between said first amplifier stage and said at least one second amplifier stage, whereby said at least one second amplifier stage amplifies said spreading tone.

7. The amplifier according to claim 1, wherein said feed forward amplifier is a dual loop feed forward amplifier having a first loop and a second loop, wherein a phase shifter circuit is contained in said first loop and said second loop and each phase shifter circuit is controlled by said null controller.

8. A feed forward amplifier for amplifying an RF signal, comprising:

an oscillator for producing input tone;

a first modulator coupled to said oscillator for spreading said tone and producing a spreading tone;

at least one amplifier for amplifying said RF signal and said spreading tone, wherein said first modulator produced intermodulation products;

a second modulator for despreading said spreading tone and producing an output tone;
    said first and second modulators comprising bi-phase modulators;

a mixer coupled to said oscillator for mixing said output tone with said input tone; and a controller coupled to said mixer for selectively adjusting said feed forward amplifier to null differences between said input tone and said output tone.

9. The amplifier according to claim 8, further including a filter disposed between said controller and said mixer for filtering said intermodulation products introduced by said at least one amplifier.

10. The amplifier according to claim 8, wherein said first modulator receives a predetermined code for spreading said spreading code and said second modulator receives the same predetermined code for despreading the spreading code.

11. The amplifier according to claim 8, wherein said intermodulation products introduced by said at least one amplifier exist at a predetermined level and said spreading tone is applied at a level below said predetermined level.

12. The amplifier according to claim 8, wherein said feed forward amplifier is a dual loop feed forward amplifier having a first loop and a second loop, wherein a phase shifter circuit is contained in said first loop and said second loop and each phase shifter circuit is controlled by said controller.

13. A method of amplifying an RF signal in a feed forward amplifier comprising the steps of:

amplifying said RF signal in a first amplification stage;

providing a source of an input tone;

spreading said input tone with a predetermined spread code to produce a spreading tone;

injecting said spreading tone over said RF signal;

amplifying said RF signal and said spreading tone in at least one second amplification stage;

despreading said spreading tone to produce an output tone;

executing said spreading and said despreading with a bi-phase modulator;

mixing the output tone with said input tone;

adjusting the feed forward amplifier to selectively reduce any difference between said input tone and said output tone.

14. The method according to claim 13, further including the step of filtering intermodulation products produced by amplification of the RF signal.

15. The method according to claim 13, wherein said step of amplifying creates intermodulation products that exist at a predetermined level and said step of injecting said spreading tone includes injecting said spreading tone at a level below said predetermined level.

16. The method according to claim 13 wherein said spreading tone is despread with said predetermined spread code used to spread said input tone.

17. The method according to claim 13 wherein said feed forward amplifier is a dual loop feed forward amplifier having a first loop and a second loop, and a phase shifter circuit is contained in said first loop and said second loop and each phase shifter circuit, wherein said step of adjusting includes adjusting each said phase shifter circuit.

* * * * *